(12) United States Patent
Zeng

(10) Patent No.: US 8,242,383 B2
(45) Date of Patent: Aug. 14, 2012

(54) PACKAGING SUBSTRATE WITH EMBEDDED SEMICONDUCTOR COMPONENT AND METHOD FOR FABRICATING THE SAME

(75) Inventor: Zhao Chong Zeng, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 352 days.

(21) Appl. No.: 12/551,674

(22) Filed: Sep. 1, 2009

(65) Prior Publication Data

US 2010/0053920 A1 Mar. 4, 2010

(30) Foreign Application Priority Data

Sep. 2, 2008 (TW) ................................ 97133577 A

(51) Int. Cl.
*H05K 1/11* (2006.01)
(52) U.S. Cl. ........................................ 174/262; 361/760
(58) Field of Classification Search .................. 361/760, 361/761, 764; 174/260, 262; 428/126, 131; 257/774, 775, E21.502, E23.011
See application file for complete search history.

(56) References Cited

U.S. PATENT DOCUMENTS

| 6,423,570 | B1 * | 7/2002 | Ma et al. | 438/106 |
|---|---|---|---|---|
| 2004/0160752 | A1 * | 8/2004 | Yamashita et al. | 361/766 |
| 2008/0176035 | A1 * | 7/2008 | Shih et al. | 428/131 |
| 2009/0073667 | A1 * | 3/2009 | Chung et al. | 361/763 |

* cited by examiner

*Primary Examiner* — Yuriy Semenenko
(74) *Attorney, Agent, or Firm* — Peter F. Corless; Steven M. Jensen; Edwards Wildman Palmer LLP

(57) ABSTRACT

A packaging substrate with an embedded semiconductor component and a method of fabricating the same are provided, including: fixing a semiconductor chip with electrode pads to an assisting layer with apertures through an adhesive member, wherein each of the electrode pads has a bump formed thereon, each of the apertures is filled with a filling material, and the bumps correspond to the apertures, respectively; forming a first dielectric layer on the assisting layer to encapsulate the semiconductor chip; removing the bumps and the filling material to form vias; and forming a first wiring layer on the first dielectric layer and forming first conductive vias in the vias to provide electrical connections between the electrode pads and the first wiring layer, wherein the first wiring layer comprises a plurality of conductive lands formed right on the first conductive vias, respectively.

5 Claims, 6 Drawing Sheets

PACKAGING SUBSTRATE WITH EMBEDDED SEMICONDUCTOR COMPONENT AND METHOD FOR FABRICATING THE SAME

BACKGROUND OF THE INVENTION

1. Field of the Invention

The present invention relates generally to packaging substrates and methods for fabricating the same, and more particularly to a packaging substrate with an embedded semiconductor component and a method for fabricating the same.

2. Description of Related Art

In addition to conventional wire bonding packages, the electronic industry developed, thanks to ever-evolving semiconductor packaging technology, various semiconductor device packages. For example, an IC semiconductor chip can be directly embedded in a packaging substrate and electrically integrated therewith so as to reduce the overall size of the semiconductor device and enhance the electrical function thereof. Such a package type has become a mainstream.

FIGS. 1A to 1D shows a method for fabricating a conventional package structure with an embedded semiconductor component. Referring to FIG. 1A, a first carrier board 10 having a first surface 10a and an opposite second surface 10b is provided, and an cavity 101 penetrating the first surface 10a and the second surface 10b is formed in the first carrier board 10. Further, a second carrier board 11 is provided and the second surface 10b of the first carrier board 10 is coupled to the second carrier board 11. Referring to FIG. 1B, a semiconductor chip 12 is provided, which has an active surface 12a with a plurality of electrode pads 121 thereon and an opposite inactive surface 12b. The inactive surface 12b of the semiconductor chip 12 is fixed, by an adhesion layer 13, in position to the second carrier board 11 exposed from the cavity 101 of the first carrier board 10. Referring to FIG. 1C, a dielectric layer 14 is formed on the first carrier board 10 and the active surface 12a of the semiconductor chip 12 by heat lamination, and also fills the gap between the cavity 101 and the semiconductor chip 12. Referring to FIG. 1D, a plurality of vias 141 are formed in the dielectric layer by laser, and then a plurality of conductive vias 16 and a third wiring layer 15 are respectively formed in the vias 141 and on the dielectric layer 14 to electrically connect to the electrode pads 121 of the semiconductor chip 12.

However, in the above-described prior art, since gap exists between the semiconductor chip 12 and the cavity 101, the semiconductor chip 12 may have a positional deviation e in the cavity 101 caused by such as pressure during the heat lamination of the dielectric layer 14, thereby resulting an alignment deviation between the conductive vias 16 and the electrode pads 121 and even causing failure of the electrical connection between the conductive vias 16 and the electrode pads 121.

Meanwhile, an alignment error may occur during the laser processing for forming the vias 141, thus resulting an alignment deviation between the conductive vias 16 and the electrode pads 121 and even causing failure of the electrical connection therebetween. In addition, the laser processing requires a high cost, has a low speed and is easy to damage the semiconductor chip 12.

Therefore, it is imperative to overcome the above-described drawbacks of the prior art.

SUMMARY OF THE INVENTION

In view of the above drawbacks of the prior art, the present invention provides a packaging substrate with an embedded semiconductor component and a method for fabricating the same so as to increase the precision of alignment between electrical connection elements and thereby enhance quality of electrical connection.

The present invention further provides a packaging substrate with an embedded semiconductor component and a method for fabricating the same so as to prevent a semiconductor chip from positional deviation which might otherwise occur due to an external force.

The present invention further provides a packaging substrate with an embedded semiconductor component and a method for fabricating the same so as to overcome the drawbacks caused by a laser processing.

In accordance with the present invention, a packaging substrate with an embedded semiconductor component comprises: a first dielectric layer; a semiconductor chip disposed in the first dielectric layer, wherein the semiconductor chip has an active surface with a plurality of electrode pads thereon and an opposite inactive surface; a first wiring layer disposed on the first dielectric layer; and an adhesive member disposed in the first dielectric layer and located right on the active surface of the semiconductor chip and the electrode pads, wherein a portion of the first wiring layer is disposed above the adhesive member, and the first wiring layer has a plurality of first conductive vias disposed in the adhesive member and electrically connecting to the electrode pads.

Therein, a conductive through hole is disposed in the first dielectric layer and electrically connecting to the first wiring layer. The first wiring layer further comprises a plurality of conductive traces, and a plurality of conductive lands located right on the first conductive vias.

In an embodiment, the adhesive member is covered by the first dielectric layer such that a portion of each of the first conductive vias is wrapped by the first dielectric layer. In another embodiment, the adhesive member is exposed from the first dielectric layer such that the portion of the first wiring layer located right on the adhesive member is directly disposed on the adhesive member.

The packaging substrate can further comprise a built-up structure disposed on the first wiring layer and the first dielectric layer, which comprises at least a second dielectric layer, a second wiring layer disposed on the second dielectric layer, and a plurality of second conductive vias disposed in the second dielectric layer and electrically connecting to the second wiring layer, portions of the second conductive vias being electrically connecting to the first wiring layer, with a solder mask layer disposed on the built-up structure and having a plurality of openings to thereby expose portions of the second wiring layer to serve as conductive pads.

The present invention further disclose a method for fabricating a packaging substrate with an embedded semiconductor component comprises: providing a carrier board and forming an assisting layer with a plurality of apertures on the carrier board, the apertures being filled with a filling material; providing a semiconductor chip having an active surface with a plurality of electrode pads and an opposite inactive surface; forming a plurality of bumps on the electrode pads respectively, wherein each of the bumps corresponds to one of the apertures and is attached to the filling material in the corresponding aperture, thereby allowing the semiconductor chip to be coupled to the assisting layer; filling an adhesive member between the assisting layer and the semiconductor chip so as to encapsulate the bumps and the electrode pads; forming a first dielectric layer on the assisting layer so as to encapsulate the semiconductor chip, wherein the first dielectric layer has a first surface and an opposite second surface, and the first surface thereof is coupled with the assisting layer; removing the carrier board for exposing the assisting layer; removing the filling material and the bumps so as to form vias; and forming in each of the vias a first conductive via that electrically connects to a corresponding one of the electrode pads.

The filling material and the bumps are made of metal or resin. The assisting layer is made of metal. A first wiring layer is formed on the first dielectric layer while forming the first conductive vias in the vias, thereby the first wiring layer electrically connected to the first conductive vias.

The method further comprises forming a conductive through hole in the first dielectric layer for electrical connection with the first wiring layer. The first wiring layer comprises a plurality of conductive traces and a plurality of conductive lands.

The method for fabricating the first wiring layer and the conductive through hole comprises: forming a through hole penetrating the first dielectric layer and the assisting layer; forming a conductive seed-layer on the assisting layer, on the walls of the vias and the through hole; forming a resist layer on the conductive seed-layer and forming a plurality of open areas in the resist layer to expose portions of the conductive seed-layer on the first dielectric layer and the conductive seed-layer on the walls of the vias and the through hole; forming an initial wiring layer in the open areas of the resist layer, forming the first conductive vias in the vias, and forming a conductive through hole in the through hole by electroplating; removing the resist layer; and removing the exposed conductive seed-layer such that the initial wiring layer forms the first wiring layer.

The method further comprises forming on the second surface of the first dielectric layer a metal layer penetrated by the through hole and topped with the conductive seed-layer. The method further comprises removing the assisting layer and the metal layer covered by the conductive seed-layer.

The method further comprises forming a built-up structure on the first wiring layer and the first dielectric layer, wherein the built-up structure comprises at least a second dielectric layer, a second wiring layer disposed on the second dielectric layer, and a plurality of second conductive vias disposed in the second dielectric layer for electrically connecting the first wiring layer and the second wiring layer, further, a solder mask layer is disposed on the built-up structure and has a plurality of openings such that portions of the second wiring layer are exposed from the openings to serve as conductive pads.

In another embodiment, the assisting layer is made of a dielectric material, which is combined with the first dielectric layer to form an integrated dielectric layer such that when the first conductive vias are formed in the vias, a first wiring layer is formed on the integrated dielectric layer and electrically connected to the first conductive vias. Other related processes of the present embodiment can refer to the processes in the case the assisting layer is made of a metal material.

According to the present invention, the semiconductor chip is first fixed in position to the assisting layer and then both the assisting layer and the semiconductor chip are coupled with the first dielectric layer. Thus, the present invention dispenses with heat lamination by dielectric layer in a later circuit forming process and thereby efficiently prevents the semiconductor chip from positional deviation which might otherwise occur under an external force.

Further, before the semiconductor chip and the assisting layer are coupled with the first dielectric layer, the bumps on the electrode pads of the semiconductor chip are aligned and attached to the filling material in the apertures of the assisting layer. Thus, the conductive vias formed later by removing the bumps and the filling material in the apertures electrically connect the electrode pads to the first wiring layer, and the electrode pads can further be aligned with an external circuit through the conductive lands of the first wiring layer formed right on the first conductive vias, thereby increasing the precision of alignment between the electrode pads and the external circuit.

Meanwhile, after the semiconductor chip and the assisting layer are coupled with the first dielectric layer, vias can be formed by removing bumps formed on the electrode pads and at the same time removing the filling material in the corresponding apertures. Therefore, the present invention dispenses with a conventional laser processing and accordingly avoids the conventional drawbacks caused by the laser processing.

DETAILED DESCRIPTION OF PREFERRED EMBODIMENTS

The following illustrative embodiments are provided to illustrate the disclosure of the present invention, these and other advantages and effects can be apparent to those skilled in the art after reading this specification.

First Embodiment

FIGS. 2A to 2M are sectional views showing a method for fabricating a packaging substrate with an embedded semiconductor component according to a first embodiment of the present invention.

Figure 1A:
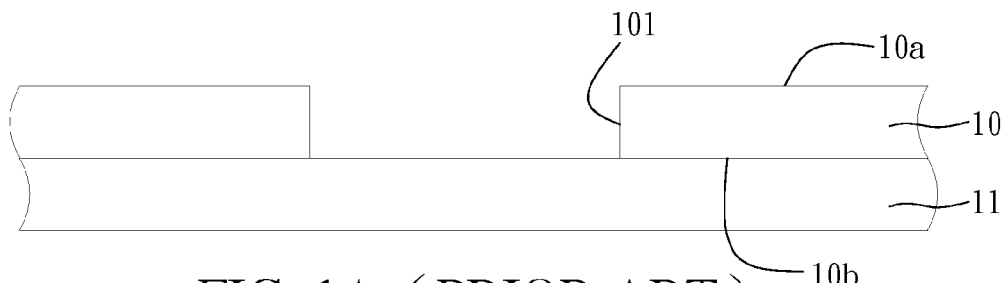
FIGS. 1A to 1D are sectional views showing a method for fabricating a conventional packaging substrate.
Figure 1B:
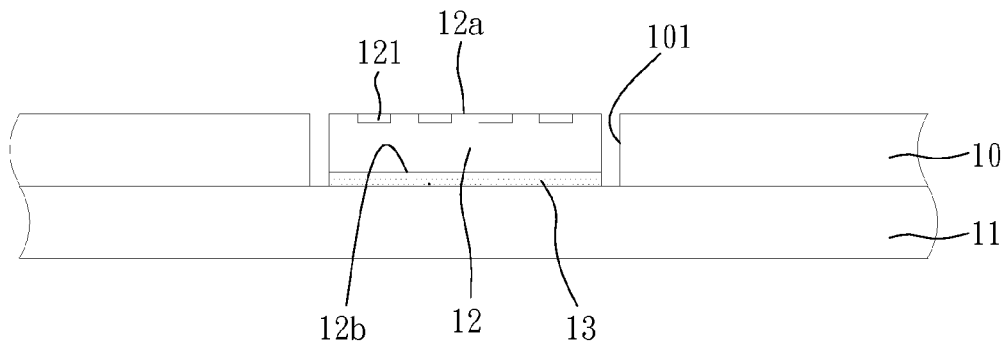
Figure 1C:
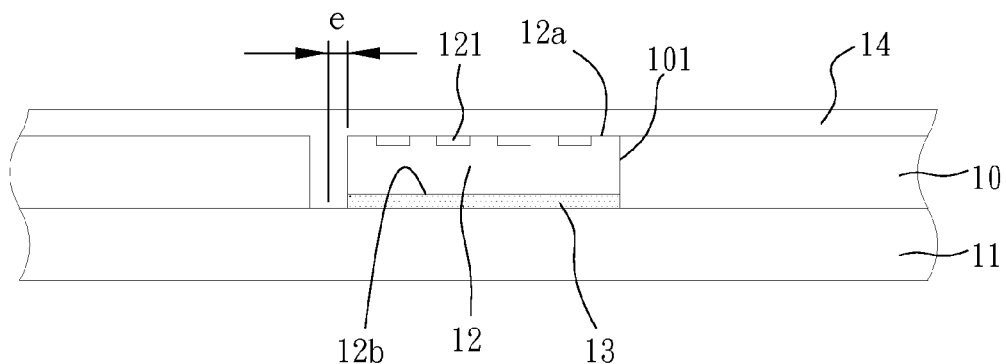
Figure 1D:
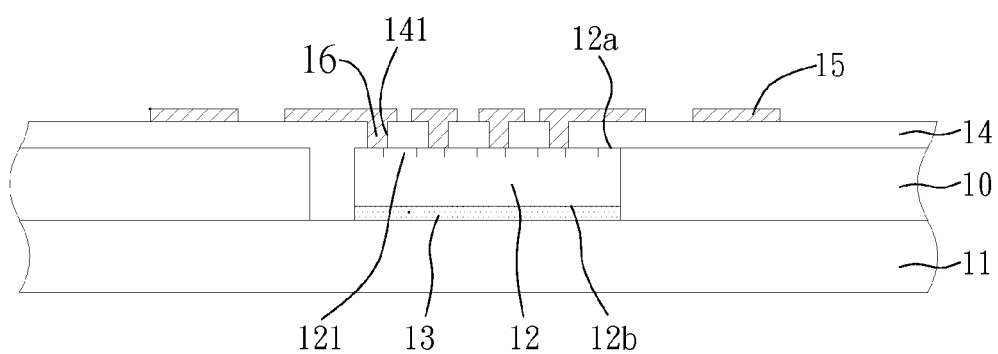
Figure 2A:
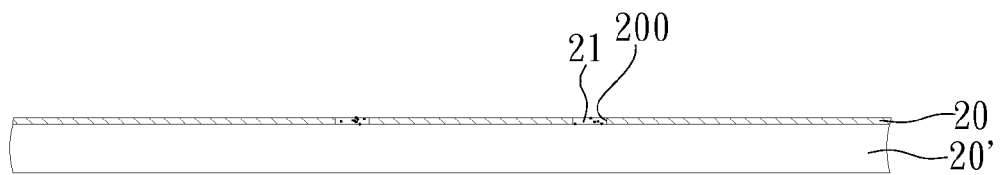
FIGS. 2A to 2M are sectional views showing a method for fabricating a packaging substrate with an embedded semiconductor component according to a first embodiment of the present invention.

Referring to FIG. 2A, a carrier board 20' is provided, and an assisting layer 20 made of a metal material is formed on the carrier board 20', wherein the assisting layer 20 has a plurality of apertures 200 each filled with a filling material 21. In the present embodiment, the assisting layer 20 is made of a copper foil.

Figure 2B:
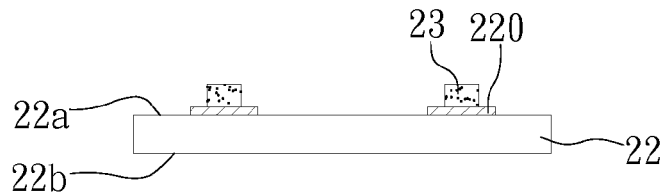

Referring to FIG. 2B, a semiconductor chip 22 has an active surface 22a with a plurality of electrode pads 220 thereon and an opposite inactive surface 22b. A plurality of bumps 23 are formed on the electrode pads 230, respectively.

Figure 2C:
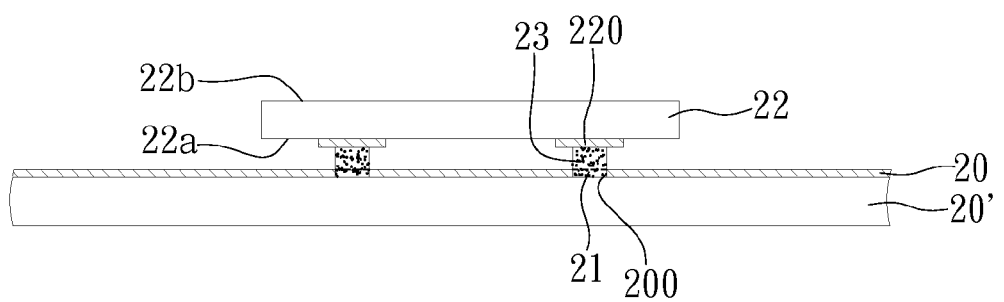

Referring to FIG. 2C, the bumps 23 correspond in position to the apertures 200, respectively, and are attached to the filling material 21 in the apertures 200, thereby allowing the semiconductor chip 22 to be coupled to the assisting layer 20. The junction (denoted by a dashed line in the drawing) of the filling material 21 and the bumps 23 is seamless and tight so as to prevent material infiltration in subsequent processes.

The bumps 23 are made of a conductive material (e.g. metal) or a non-conductive material (e.g. resin) that matches the filling material 21. In the present embodiment, the bumps 23 are made of the same material as the filling material 21. Thus, the bumps 23 and the filling material 21 can be seen as a single structural entity. In other embodiments, the bumps 23 and the filling material 21 can be made of different materials.

Figure 2D:
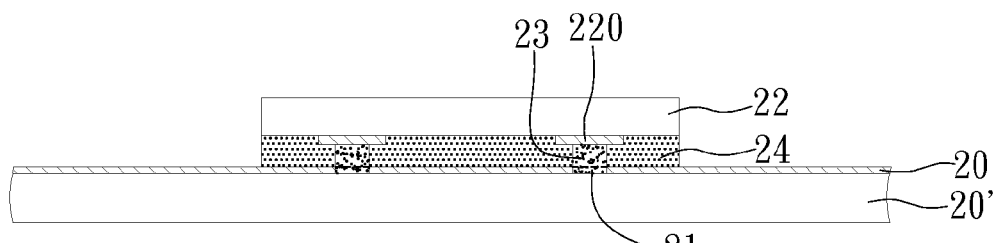

Referring to FIG. 2D, an adhesive member 24 is filled between the assisting layer 20 and the semiconductor chip 22 so as to encapsulate the bumps 23 and the electrode pads 220 and enable the semiconductor chip 22 to be fixed in position to the assisting layer 20.

Figure 2E:
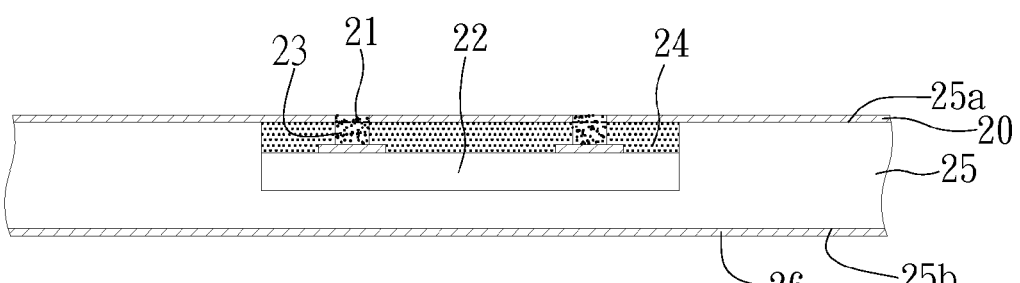

Referring to FIG. 2E, a first dielectric layer 25 with a first surface 25a and an opposite second surface 25b is formed on the assisting layer 20 to encapsulate the semiconductor chip 22. As shown in the drawing, the first surface 25a is coupled with the assisting layer 20, and the second surface 25b has a metal layer 26 formed thereon. Subsequently, the carrier board 20' is removed to expose the assisting layer 20.

Figure 2F:
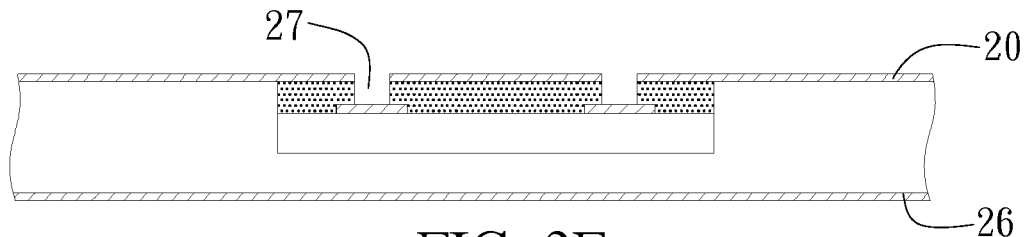

Referring to FIG. 2F, the filling material 21 and the bumps 23 are removed to form a plurality of vias 27. Since the bumps 23 and the filling material 21 are made of the same material, they can be removed through the same process, thereby enhancing efficiency of the process.

According to the present invention, the vias 27 can be formed by removing the bumps 23 on the electrode pads 220 and the filling material 21 in the corresponding apertures 200 instead of using a conventional laser processing, thereby overcoming the drawbacks caused by the laser processing, such as low precision, low speed and damage done to the semiconductor chip 22.

Figure 2G:
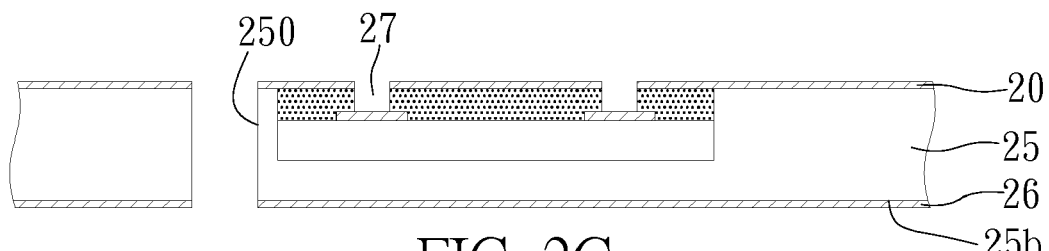
Figure 2H:
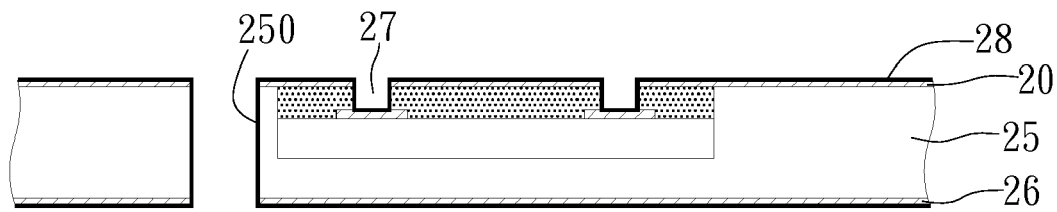

Referring to FIGS. 2G and 2H, a through hole 250 is formed to penetrate the metal layer 26, the first dielectric layer 25 and the assisting layer 20, and a conductive seed-layer 28 is formed on the metal layer 26, on the assisting layer 20, on the walls of the vias 27 and the through hole 250.

Figure 2I:
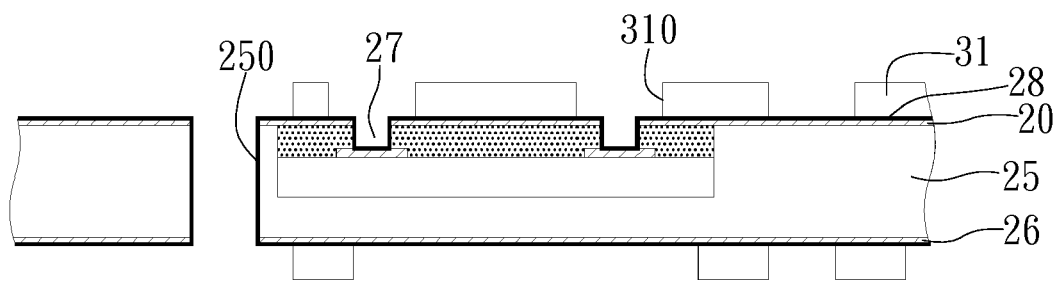
Figure 2J:
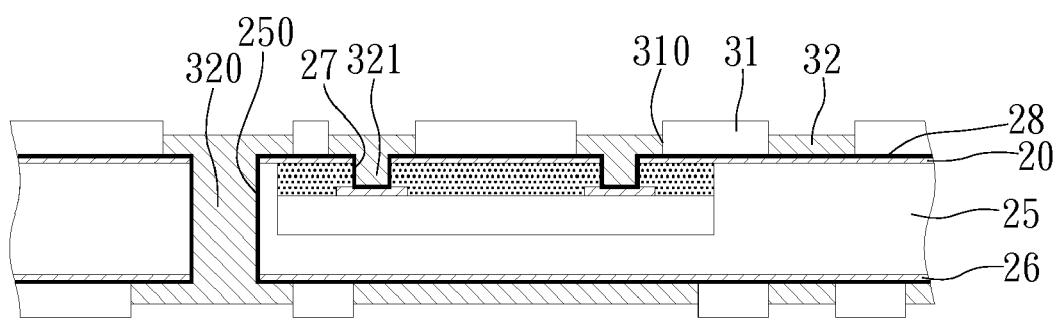

Referring to FIGS. 2I and 2J, a resist layer 31 is formed on the conductive seed-layer 28, and a plurality of open areas 310 are formed in the resist layer 31 for exposing portions of the conductive seed-layer 28 on the first dielectric layer 25 and the conductive seed-layer 28 on the walls of the vias 27 and the through hole 250, respectively. Subsequently, through an electroplating process, an initial wiring layer 32 is formed in the open areas 310, a plurality of first conductive vias 321 are formed in the vias 27 to electrically connect to the electrode pads 220, and a conductive through hole 320 is formed in the through hole 250.

Figure 2K:
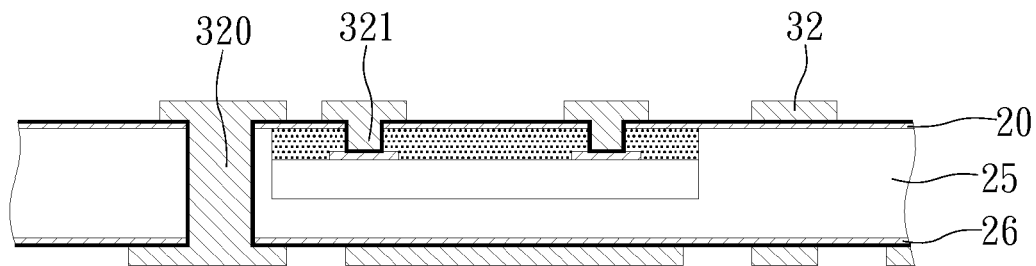
Figure 2L:
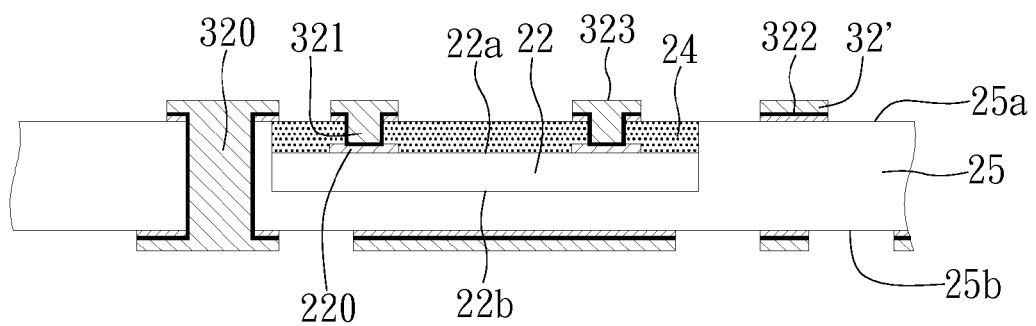

Referring to FIGS. 2K and 2L, the resist layer 31 is removed, the exposed conductive seed-layer 28 as well as the assisting layer 20 and the metal layer 26 covered by the exposed conductive seed-layer 28 are etched away, and a portion of the top surface of the initial wiring layer 32 is also etched away, thereby forming a first wiring layer 32'. Therein, the first wiring layer 32' is electrically connected to the conductive through hole 320 and comprises a plurality of conductive lands 323 on the conductive vias 321 and conductive traces 322.

Figure 2M:
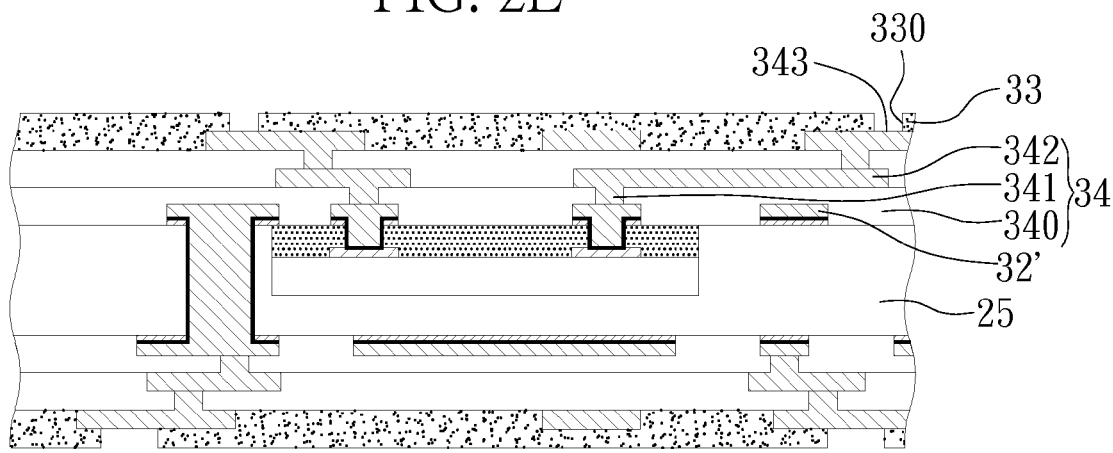

Referring to FIG. 2M, a built-up structure 34 is formed on the first dielectric layer 25 and the first wiring layer 32', wherein the first built-up structure 34 comprises at least a second dielectric layer 340, a second wiring layer 342 formed on the second dielectric layer 340, and a plurality of second conductive vias 341 formed in the second dielectric layer 340 and electrically connecting to the second wiring layer 342, further, portions of the second conductive vias 341 electrically connecting to the conductive lands 323 of the first wiring layer 32' via the bottoms thereof. Subsequently, a solder mask layer 33 is formed on the outermost second dielectric layer 340 and second wiring layer 341 of the built-up structure 34, and a plurality of openings 330 are formed in the solder mask layer 33 such that portions of the second wiring layer 341 can be exposed from the openings 330 to serve as conductive pads 343 for electrical connecting with other electronic components.

Second Embodiment

FIGS. 3A to 3J are sectional views showing a method for fabricating a packaging substrate with an embedded semiconductor component according to a second embodiment of the present invention. In the present embodiment, the assisting layer 20 is made of a dielectric material.

Figure 3A:
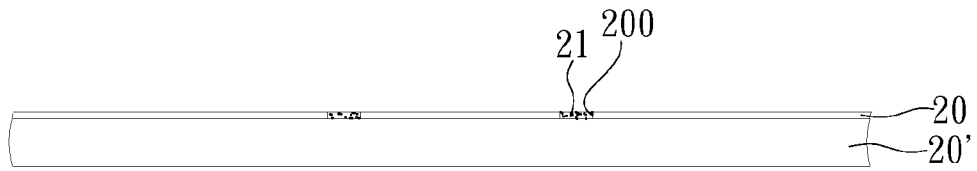
FIGS. 3A to 3J are sectional views showing a method for fabricating a packaging substrate with an embedded semiconductor component according to a second embodiment of the present invention.

Referring to FIG. 3A, a carrier board 20' is provided, and an assisting layer 20 made of a dielectric material is formed on the carrier board 20', wherein the assisting layer 20 has a plurality of apertures 200 each filled with a filling material 21.

Figure 3B:
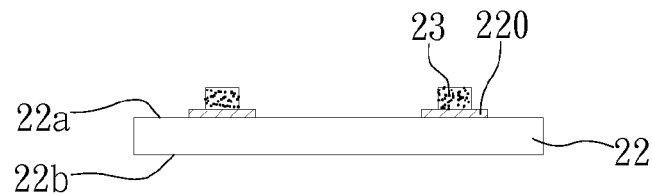
Figure 3C:
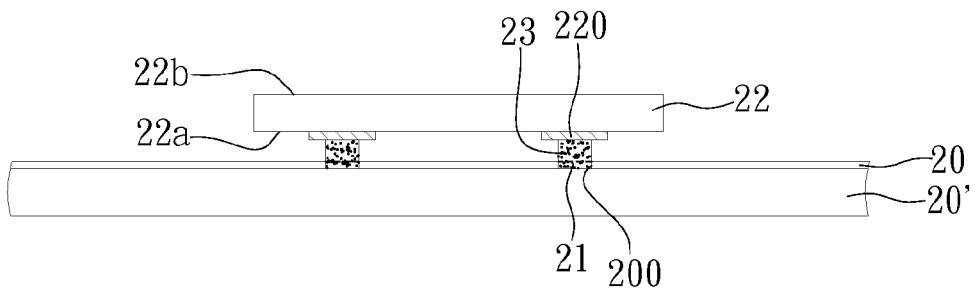
Figure 3D:
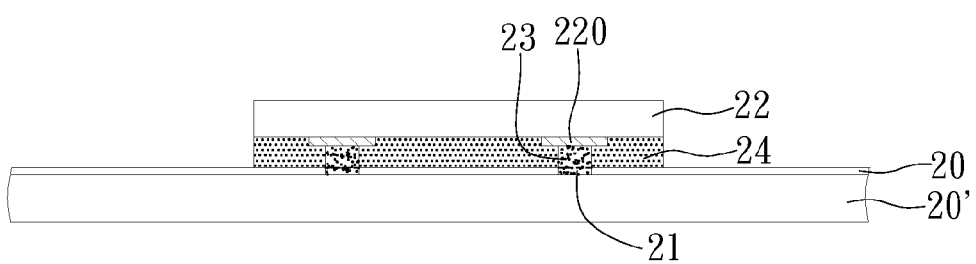

Referring to FIGS. 3B to 3D, a plurality of bumps 23 are formed on the electrode pads 220 of the semiconductor chip 22, respectively. The bumps 23 correspond in position to the apertures 200, respectively, and are attached to the filling material 21 in the apertures 200, so as for the semiconductor chip 22 to be fixed in position to the assisting layer 20. Further, an adhesive member 24 is filled between the assisting layer 20 and the semiconductor chip 22, thereby allowing the semiconductor chip 22 to be fixed in position to the assisting layer 20.

Figure 3E:
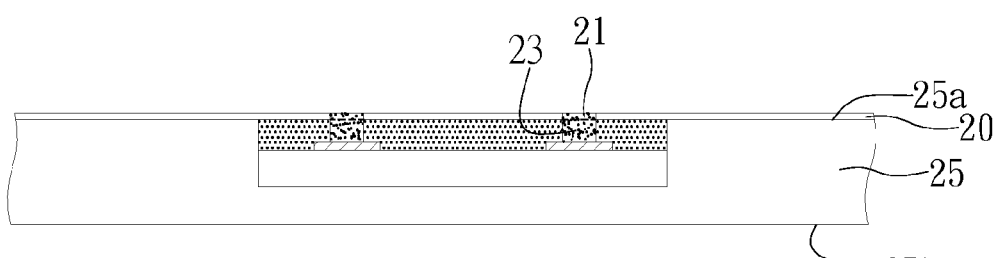

Referring to FIG. 3E, a first dielectric layer 25 having a first surface 25a and an opposite second surface 25b is formed on the assisting layer 20, wherein the first surface 25a of the first dielectric layer 25 is coupled with the assisting layer 20. Subsequently, the carrier board 20' is removed to expose the assisting layer 20.

Figure 3F:
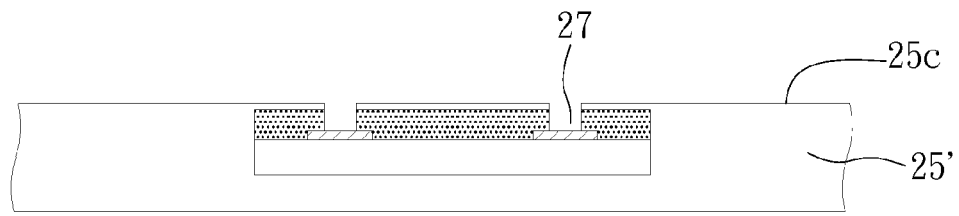
Figure 3G:
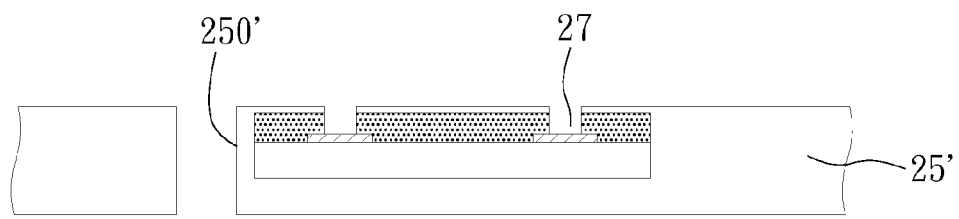

Referring to FIGS. 3F and 3G, the assisting layer 20 made of a dielectric material can be combined with the first dielectric layer 25 so as to form an integrated dielectric layer 25', wherein the integrated dielectric layer 25' has a third surface 25c corresponding to the first surface 25a of the first dielectric layer 25. Then, the filling material 21 and the bumps 23 are removed to form vias 27, and a through hole 250' is formed to penetrate the integrated dielectric layer 25'.

Figure 3H:
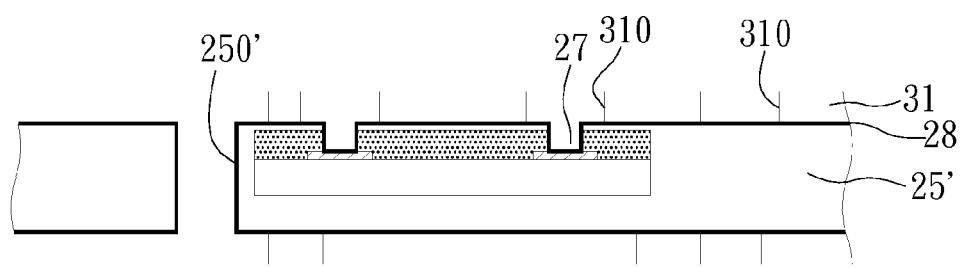

Referring to FIG. 3H, a conductive seed-layer 28 and a resist layer 31 are sequentially formed on the integrated dielectric layer 25', and a plurality of open areas 310 are formed in the resist layer 31 for exposing portions of the conductive seed-layer 28 located on the integrated dielectric layer 25' and and the conductive seed-layer 28 on the walls of the vias 27 and the through hole 250'.

Figure 3I:
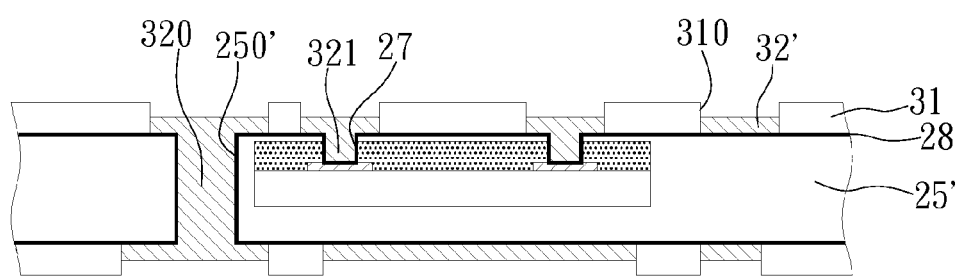

Referring to FIG. 3I, through an electroplating process, a first wiring layer 32' is formed on the integrated dielectric layer 25' in the open areas 310, and a plurality of first conductive vias 321 are formed in the vias 27, respectively, so as to electrically connect the electrode pads 220 with the first wiring layer 32'. As shown in the drawing, a conductive through hole 320 is formed in the through hole 250' for electrical connection with the first wiring layer 32'.

Figure 3J:
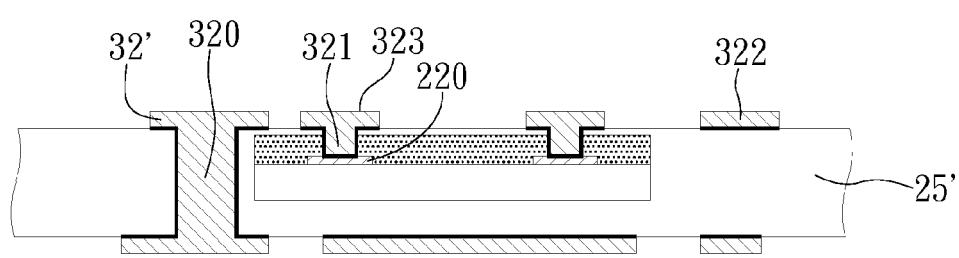

Referring to FIG. 3J, the resist layer 31 and the conductive seed-layer 28 covered by the resist layer 31 are removed. The first wiring layer 32' comprises a plurality of conductive lands 323 and conductive traces 322. Further, a process as shown in FIG. 2L can be performed so as to form a built-up structure on the first wiring layer 32' and the integrated dielectric layer 25'. Detailed description thereof is omitted herein.

According to the present invention, the semiconductor chip 22 is fixed, by the adhesive member 24, in position to the assisting layer 20 and then both the assisting layer 20 and the semiconductor chip 22 are coupled with the first dielectric layer 25. Thus, the present invention dispenses with heat lamination of the first dielectric layer 25 and thereby efficiently prevents the semiconductor chip 22 from positional deviation which might otherwise occur under an external force.

Before the semiconductor chip 22 is disposed in the first dielectric layer 25, the bumps on the electrode pads 220 of the semiconductor chip 22 are already aligned and attached to the filling material in the apertures 200 of the assisting layer 20. As a result, the semiconductor chip 22 is prevented from positional deviation which might otherwise occur due to heat or flow of the dielectric layer. In addition, the first conductive vias 321 formed later by removing the bumps and the filling material in the apertures 200 electrically connect the electrode pads 220 of the semiconductor chip 22 to the first wiring layer 32', and the electrode pads 220 can further be aligned with a built-up structure through the conductive lands 323 located right on the first conductive vias 321, thereby increasing the precision of alignment between the electrode pads 220 and the external circuit.

Referring to FIG. 2L, a packaging substrate with an embedded semiconductor component is provided, which comprises: a first dielectric layer 25 having a first surface 25a, an opposite second surface 25b and a conductive through hole 320; a semiconductor chip 22 disposed in the first dielectric layer 25, wherein the semiconductor chip 22 has an active surface 22a with a plurality of electrode pads 220 thereon and an opposite inactive surface 22b; a first wiring layer 32' disposed on the first dielectric layer 25 and electrically connected to the conductive through hole 320; and an adhesive member 24 disposed in the first dielectric layer 25 and located right on the active surface 22a of the semiconductor chip 22 with the electrode pads 220 thereon, wherein a portion of the first wiring layer 32' is disposed at a position corresponding to the adhesive member 24, and a plurality of first conductive vias 321 are disposed in the adhesive member 24 to provide electrically connections between the first wiring layer 32' and the electrode pads 220 of the semiconductor chip 22. The first wiring layer 32' further comprises a plurality of conductive lands 323 located right on the first conductive vias 321 and conductive traces 322.

Referring to FIG. 2L, the adhesive member 24 is exposed from the first dielectric layer 25 such that the portion of the first wiring layer 32' located right on the adhesive member 24 is directly disposed on the adhesive member 24. Alternatively, as shown in FIG. 3J, the adhesive member 24 is covered by the integrated dielectric layer 25' such that the portion of the first wiring layer 32' corresponding in position to the adhesive member 24 is disposed on the integrated dielectric layer 25'.

The packaging substrate further comprises a built-up structure 34 disposed on the first wiring layer 32' and the first dielectric layer 25. The built-up structure 34 comprises at least a second dielectric layer 340, a second wiring layer 342 disposed on the second dielectric layer 340, and a plurality of second conductive vias 341 disposed in the second dielectric layer 340 and electrically connecting to the second wiring layer 342. Portions of the second conductive vias 341 electrically connect to the conductive lands 323 of the first wiring layer 32'. A solder mask layer 33 with a plurality of openings 330 therein is formed on the built-up structure 34, and thus portions of the second wiring layer 342 can be exposed from the openings 330 to serve as conductive pads 343.

According to the present invention, a semiconductor chip is first fixed to an assisting layer with the electrode pads thereof corresponding in position to first conductive vias to be formed later and then both the assisting layer and the semiconductor chip are disposed in a first dielectric layer, which not only efficiently prevents the semiconductor chip from positional deviation which might otherwise occur under an external force during subsequent processes but also enables the electrode pads to be aligned with an external structure through the first conductive vias so as to increase the precision of alignment between the electrode pads and the external structure and enhance the electrical connection quality. Meanwhile, the present invention dispenses with a conventional laser processing for forming the conductive vias and accordingly avoids the conventional drawbacks otherwise caused by the laser processing.

The above-described descriptions of the specific embodiments are intended to illustrate the preferred implementation according to the present invention but are not intended to limit the scope of the present invention, Accordingly, all modifications and variations carried out to the specific embodiments by persons ordinary skilled in the art should fall within the scope of present invention as defined by the appended claims.

What is claimed is:

1. A packaging substrate with an embedded semiconductor chip, comprising:
a first dielectric layer;
the semiconductor chip having an active surface with a plurality of electrode pads thereon and an opposite inactive surface, and disposed in the first dielectric layer;
a first wiring layer disposed on the first dielectric layer; and
an adhesive member disposed in and covered by the first dielectric layer and located right on the active surface of the semiconductor chip and the electrode pads, wherein a portion of the first wiring layer is disposed above the adhesive member, and the first wiring layer has a plurality of first conductive vias disposed through the first dielectric layer and the adhesive member so as to contact with and electrically connect to the electrode pads of the semiconductor chip.

2. The substrate of claim 1, wherein a conductive through hole is disposed in the first dielectric layer and electrically connecting to the first wiring layer.

3. The substrate of claim 1, wherein the first wiring layer further comprises: a plurality of conductive traces, and a plurality of conductive lands located right on the first conductive vias.

4. The substrate of claim 1, further comprising a built-up structure disposed on the first wiring layer and the first dielectric layer, wherein the built-up structure comprises at least a second dielectric layer, a second wiring layer disposed on the second dielectric layer, and a plurality of second conductive vias disposed in the second dielectric layer and electrically connecting to the second wiring layer, wherein portions of the second conductive vias electrically connect to the first wiring layer, with a solder mask layer disposed on the built-up structure and having a plurality of openings for exposing portions of the second wiring layer therefrom to serve as conductive pads.

5. A packaging substrate with an embedded semiconductor chip, comprising:
a first dielectric layer;
the semiconductor chip having an active surface with a plurality of electrode pads thereon and an opposite inactive surface, and embedded in the first dielectric layer;
a first wiring layer disposed on the first dielectric layer; and
an adhesive member embedded in the first dielectric layer and exposed from the first dielectric layer and located right on the active surface of the semiconductor chip and the electrode pads, wherein a portion of the first wiring layer corresponding in position to the adhesive member is directly disposed on the adhesive member, and the first wiring layer has a plurality of first conductive vias disposed through the adhesive member so as to contact with and electrically connect to the electrode pads of the semiconductor chip.

* * * * *